(12) United States Patent
Takano et al.

(10) Patent No.: US 11,500,008 B2
(45) Date of Patent: Nov. 15, 2022

(54) SEMICONDUCTOR DEVICE AND CRACK DETECTION METHOD

(71) Applicant: Mitsubishi Electric Corporation, Tokyo (JP)

(72) Inventors: Kazutoyo Takano, Fukuoka (JP); Hiroyuki Nakamura, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 81 days.

(21) Appl. No.: 17/094,157

(22) Filed: Nov. 10, 2020

(65) Prior Publication Data

US 2021/0223305 A1 Jul. 22, 2021

(30) Foreign Application Priority Data

Jan. 20, 2020 (JP) .............................. JP2020-006563

(51) Int. Cl.
*G01R 31/26* (2020.01)
*H01L 29/739* (2006.01)
*H01L 29/06* (2006.01)
*H01L 21/66* (2006.01)

(52) U.S. Cl.
CPC .......... *G01R 31/2601* (2013.01); *H01L 22/32* (2013.01); *H01L 29/0623* (2013.01); *H01L 29/7397* (2013.01)

(58) Field of Classification Search
CPC ............ G01R 31/2601; G01R 31/2644; G01R 31/2858; G01R 31/2884; H01L 22/32; H01L 29/0623; H01L 29/7397; H01L 29/1095; H01L 29/407; H01L 29/0615; H01L 29/0619; H01L 29/0638; H01L 29/7802; H01L 29/7803; H01L 29/7811; H01L 29/7813; H01L 22/14; H01L 22/34; H01L 23/544; H01L 22/12; G01N 27/00
USPC ...................... 324/762.05, 762.01, 537, 500
See application file for complete search history.

(56) References Cited

U.S. PATENT DOCUMENTS

| | | | |
|---|---|---|---|
| 6,274,501 B1 * | 8/2001 | Riccobene ......... | G01R 31/2648 438/719 |
| 2008/0303138 A1 * | 12/2008 | Flett ...................... | H01L 23/473 257/E23.098 |
| 2009/0102501 A1 * | 4/2009 | Guldi ...................... | H01L 22/34 324/762.1 |

(Continued)

FOREIGN PATENT DOCUMENTS

JP 2015-167207 A 9/2015

*Primary Examiner* — Giovanni Astacio-Oquendo
(74) *Attorney, Agent, or Firm* — Studebaker & Brackett PC

(57) ABSTRACT

Provided is a semiconductor device that can detect the cracking progress with high precision. A semiconductor device is formed using a semiconductor substrate, and includes an active region in which a semiconductor element is formed, and an edge termination region outside the active region. A crack detection structure is termed in the edge termination region of the semiconductor substrate. The crack detection structure includes: a trench formed in the semiconductor substrate and extending in a circumferential direction of the edge termination region; an inner-wall insulating film formed on an inner wall of the trench; an embedded electrode formed on the inner-wall insulating film and embedded into the trench; and a monitor electrode formed on the semiconductor substrate and connected to the embedded electrode.

6 Claims, 8 Drawing Sheets

(56) References Cited

U.S. PATENT DOCUMENTS

2012/0293160 A1* 11/2012 Koto .................. G01N 27/4143
324/76.11
2018/0308973 A1* 10/2018 Ebiike ..................... H01L 22/12
2018/0350960 A1* 12/2018 Naito .................. H01L 21/3223

* cited by examiner

SEMICONDUCTOR DEVICE AND CRACK DETECTION METHOD

BACKGROUND OF THE INVENTION

Field of the Invention

The present disclosure relates to a semiconductor device, and particularly to a technology for detecting a crack in the semiconductor device.

Description of the Background Art

In response to the market demand for saving energy of power devices and downsizing the power devices, wafers have been thinned to reduce a loss in the actual use of the power devices. Although thinning wafers leads to enhanced electrical characteristics, it causes problems in mass production, such as the difficulty in handling the wafers and adding constraints to various processes in manufacturing semiconductor devices. Particularly, in a process of dicing a wafer into chips, various factors cause a crack, chipping, or a fracture (hereinafter collectively referred to as a "crack") in a dicing line portion of the wafer because the wafer is physically cut using, for example, a diamond cutter. The various factors include a foreign substance on the wafer, chipping or a fracture of the cutter, warpage of the wafer, and a surface state of the wafer. To prevent the crack, wafer processes have been improved day by day through improvement activities such as small group activities.

To prevent the release of cracked chips, chips with large cracks that are identifiable through a test for measuring the electrical characteristics or visual inspection can be almost reliably rejected. However chips with minute cracks that do not affect the electrical characteristics and are hardly identified through visual inspection may be unfortunately sent to subsequent processes. Although the release of the chips with minute cracks have almost no influence over the subsequent processes, on rare occasion, the assembly stress or the stress caused by harsh environments (heat or physical forces) in actual use sometimes contributes to the progress of cracks. Thus, a technology for enabling precise monitoring of the cracking progress in the chips has been sought.

For example, Japanese Patent Application Laid-Open No. 2015-167207 (hereinafter referred to as Patent Document 1) discloses a technology for determining the presence or absence of a crack in a chip by extending, around an effective region of the chip (a region in which a semiconductor element is formed) as a crack detection line, a diffusion layer formed in a semiconductor layer or an electrode directly embedded in the semiconductor layer, and measuring a resistance value of the diffusion layer or the electrode using two pads connected to the diffusion layer or the electrode.

Since the presence or absence of a crack is determined based on the resistance value of the crack detection line (the diffusion layer or the electrode) according to the technology of Patent Document 1, the crack cannot be detected unless a slit in the crack detection line is large enough to greatly change the resistance value of the line. Thus, the technology of Patent Document 1 hardly detects the cracking progress with high precision.

SUMMARY

Provided is n semiconductor device that can detect the cracking progress with high precision.

A semiconductor device according to the present disclosure includes: a semiconductor layer including an active region in which a semiconductor element is formed, and an edge termination region outside the active region; and a crack detection structure termed in the edge termination region. The crack detection structure includes: a trench formed in the semiconductor layer and extending in a circumferential direction of the edge termination region; an inner-wall insulating film formed on an inner wall of the trench; an embedded electrode formed on the inner-wall insulating film and embedded into the trench; and a monitor electrode formed on the semiconductor layer and connected to the embedded electrode.

The semiconductor device according to this disclosure can monitor the cracking progress by measuring the leakage current or the potential difference between the monitor electrode and another electrode. Once a crack reaches the crack detection structure, the leakage current or the potential difference is greatly changed. Thus, the cracking progress can be detected with high precision.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
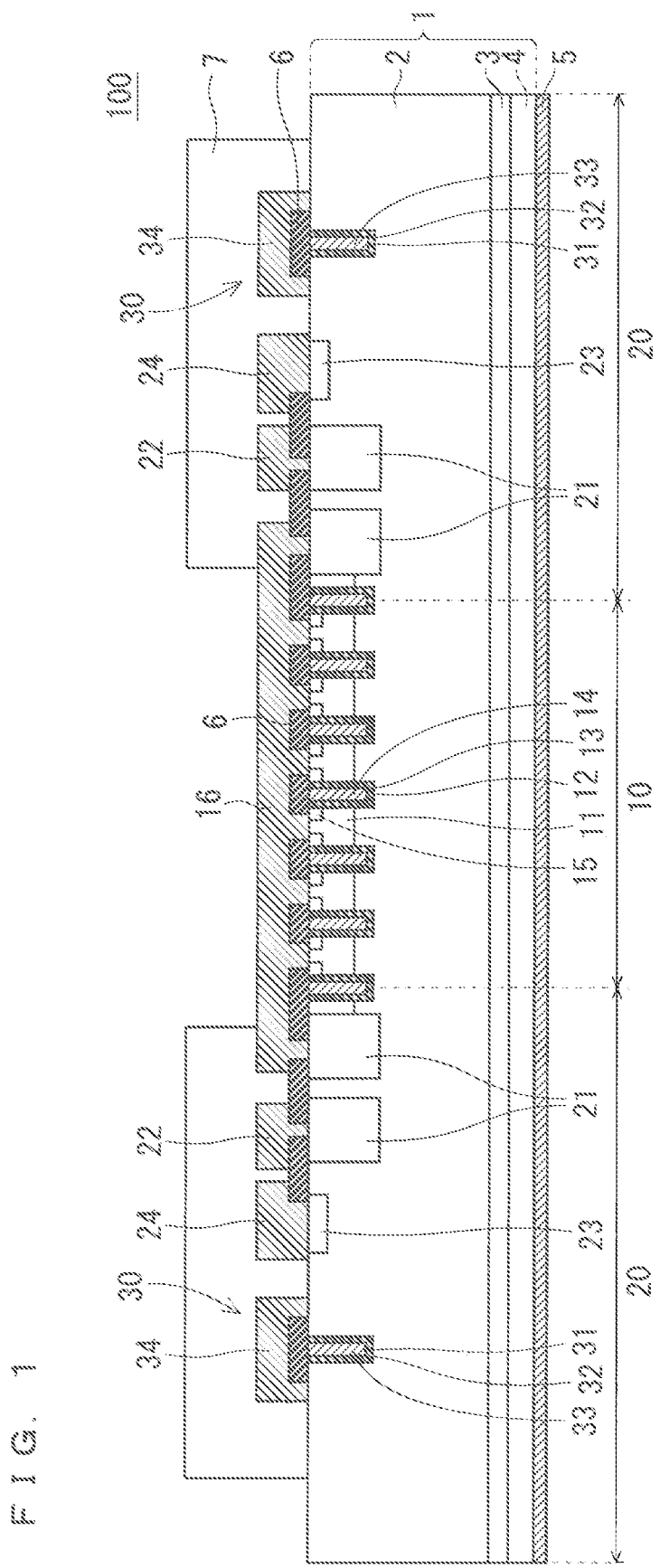
FIG. 1 is a cross section illustrating a structure of a semiconductor device according to Embodiment 1.

FIG. 1 is a cross section illustrating a structure of a semiconductor device 100 according to Embodiment 1. According to Embodiment 1, a semiconductor element included in the semiconductor device 100 is an insulated-gate bipolar transistor (IGBT), specifically, a trench-gate IGBT. The semiconductor element may be an element other than the IGBT, for example, a metal-oxide-semiconductor field effect transistor (MOSFET) or a diode. Furthermore, the IGBT or the MOSFET may be a planar-gate IGBT or MOSFET. Although the first conductivity type is n-type and the second conductivity type is p-type in this description, conversely, the first conductivity type may be p-type and the second conductivity type may be n-type.

The semiconductor device 100 is formed using a semiconductor substrate 1 as a semiconductor layer. Although the semiconductor substrate 1 is made of silicon herein, the semiconductor substrate 1 may be made of a material other than silicon, for example, a wide bandgap semiconductor such as SiC or GaN. The semiconductor device 100 including the semiconductor substrate 1 made of a wide bandgap semiconductor is superior to that including the semiconductor substrate 1 made of silicon in operating at a high voltage, a large current, and a high temperature.

As illustrated in FIG. 1, the semiconductor substrate 1 includes: an n-type drift layer 2 of the first conductivity type which is formed in an upper surface portion of the semiconductor substrate 1; an n-type buffer layer 3 of the first conductivity type which is formed under the n-type drift layer 2 and higher in peak impurity concentration than the n-type drift layer 2; and a p-type collector layer 4 of the second conductivity type which is formed in a lower surface portion of the semiconductor substrate 1. The n-type buffer layer 3 is interposed between the n-type drift layer 2 and the p-type collector layer 4. Furthermore, a collector electrode 5 of the IGBT is formed on the lower surface of the semiconductor substrate 1.

The semiconductor device 100 includes an active region 10 in which a semiconductor element (IGBT) is formed, and an edge termination region 20 formed outside the active region 10. The edge termination region 20 is a ring-shaped region surrounding the active region 10.

First, the structure of the active region 10 will be described. In the active region 10, a p-type base layer 11 of the second conductivity type is formed in the surface portion of the n-type drift layer 2. Furthermore, gate trenches 12 reaching the n-type drift layer 2 under the p-type base layer 11 are formed in the upper surface of the semiconductor substrate 1. A gate insulating film 13 of the IGBT which is, for example, a silicon oxide film is formed as an inner wall (a side surface and a bottom surface) of each of the gate trenches 12. A gate electrode 14 of the IGBT which is made of, for example, a metal such as polysilicon or aluminum is formed on the gate insulating film 13 to be embedded into each of the gate trenches 12. N$^+$ source regions 15 of the first conductivity type are formed in the surface portion of the p-type base layer 11 to be adjacent to the gate trenches 12. The gate electrode 14 faces the n$^+$ source regions 15, the p-type base layer 11, and the n-type drift layer 2 through the gate insulating film 13.

An interlayer insulating film 6 is formed on the semiconductor substrate 1 to cover the gate electrodes 14. An emitter electrode 16 is formed on the interlayer insulating film 6. Contact holes reaching the n$^+$ source regions 15 and the p-type base layer 11 are formed in the interlayer insulating film 6. The emitter electrode 16 is connected to the n$^+$ source regions 15 and the p-type base layer 11 through the contact holes.

Next, a structure of the edge termination region 20 will be described. In the edge termination region 20, a field limiting ring (FLR) 21 of the second conductivity type (p-type) which surrounds the outside of the p-type base layer 11 and which is higher in peak impurity concentration than the p-type base layer 11 is formed in the surface portion of the n-type drift layer 2. The FLR 21 is also covered with the interlayer insulating film 6. An FLR electrode 22 that is connected to the FLR 21 through contact holes is formed on the interlayer insulating film 6. A channel stopper layer 23 of the first conductivity type (n-type) which is higher in peak impurity concentration than the n-type drill layer 2 is formed in the surface portion of the n-type drift layer 2 to surround the outside of the FLR 21. The channel stopper layer 23 is also covered with the interlayer insulating film 6. A channel stopper electrode 24 that is connected to the channel stopper layer 23 through a contact hole is formed on the interlayer insulating film 6.

The semiconductor device 100 according to Embodiment 1 includes, in the edge termination region 20, a crack detection structure 30 which is a wiring structure for detecting a crack and which surrounds the outside of the channel stopper electrode 24. The crack detection structure 30 is formed in the n-type drift layer 2 of the semiconductor substrate 1, and includes a trench 31 extending in the circumferential direction of the edge termination region 20, an inner-wall insulating film 32 formed as an inner wall (a side surface and a bottom surface) of the trench 31, an embedded electrode 33 formed on the inner-wall insulating film 32 and embedded into the trench 31, and a monitor electrode 34 formed on the semiconductor substrate 1 and connected to the embedded electrode 33.

Although the interlayer insulating film 6 is interposed between the monitor electrode 34 and the embedded electrode 33 in the cross section of FIG. 1, the monitor electrode 34 is connected to the embedded electrode 33 through a contact hole formed in the interlayer insulating film 6 in a region which is not illustrated. Although there is no constraint on the position of the region in which the monitor electrode 34 is connected to the embedded electrode 33, for example, the region should be placed at a corner of a chip where an invalid region is easily formed. In such a case, the invalid region can be reduced by narrowing the width of the monitor electrode 34 in a portion other than the corner in the chip.

Furthermore, a glass coat 7 is formed on the upper surface of the semiconductor device 100 as a protective film. The glass coat 7 has an opening for exposing the upper surface of the emitter electrode 16 to allow the emitter electrode 16 to be connected to, for example, a wire. The glass coat 7 also has an opening for exposing the upper surface of the monitor electrode 34 in a region which is not illustrated (e.g., a corner of a chip) to allow the monitor electrode 34 to be connected to a wire and allow a probe to come in contact with the monitor electrode 34.

In Embodiment 1, the trench 31 is as deep as the gate trenches 12. The thickness and the material of the inner-wall insulating film 32 are identical to the thickness and the material (e.g., a silicon oxide film) of the gate insulating films 13. The material of the embedded electrode 33 is identical to the material (e.g., a metal such as polysilicon or aluminum) of the gate electrodes 14. Since the trench 31, the inner-wall insulating film 32, and the embedded electrode 33 can be formed in the same processes as those of the gate trenches 12, the gate insulating films 13, and the gate electrodes 14, respectively, increase in the number of manufacturing processes due to addition of the crack detection structure 30 to the semiconductor device 100 can be suppressed.

The cracking progress in the semiconductor device 100 can be monitored by monitoring the leakage current or the potential difference between the monitor electrode 34 and another electrode. Here, the other electrode may be, for example, one of the emitter electrode 16, the collector electrode 5, the FLR electrode 22, end the channel stopper electrode 24. When the semiconductor device 100 includes a plurality of the crack detection structures 30, the cracking progress may be monitored by monitoring the leakage current or the potential difference between two of the monitor electrodes 34. Here, one of the two monitor electrodes 34 is the other electrode.

Assume that a crack is monitored based on the leakage current between the monitor electrode 34 and the other electrode. When a crack does not reach the crack detection structure 30, the leakage current is limited to that in the inner-wall insulating film 32 and thus is of the order of picoamperes (pA) or less. When a crack reaches the crack detection structure 30, insulation of the inner-wall insulating film 32 does not work, so that the leakage current increases by several orders of magnitude to the order of nanoamperes (nA) or more. Thus, once a crack reaches the crack detection structure 30 without a large slit in the crack detection structure 30, the leakage current is greatly changed. Thus, the cracking progress can be determined with high precision.

Assume that a crack is monitored based on a potential difference between the monitor electrode 34 and the other electrode. When a crack does not reach the crack detection structure 30, the monitor electrode 34 and the other electrode are in an open state (a state in which several voltages to several tens of voltages can be applied). When a crack reaches the crack detection structure 30, the state is changed into a short state (a state in which a voltage as low as 1 V or less can be applied). Thus, once a crack reaches the crack detection structure 30 without a large slit in the crack detection structure 30, the potential difference is greatly changed. Thus, the cracking progress can be determined with high precision.

Figure 2:
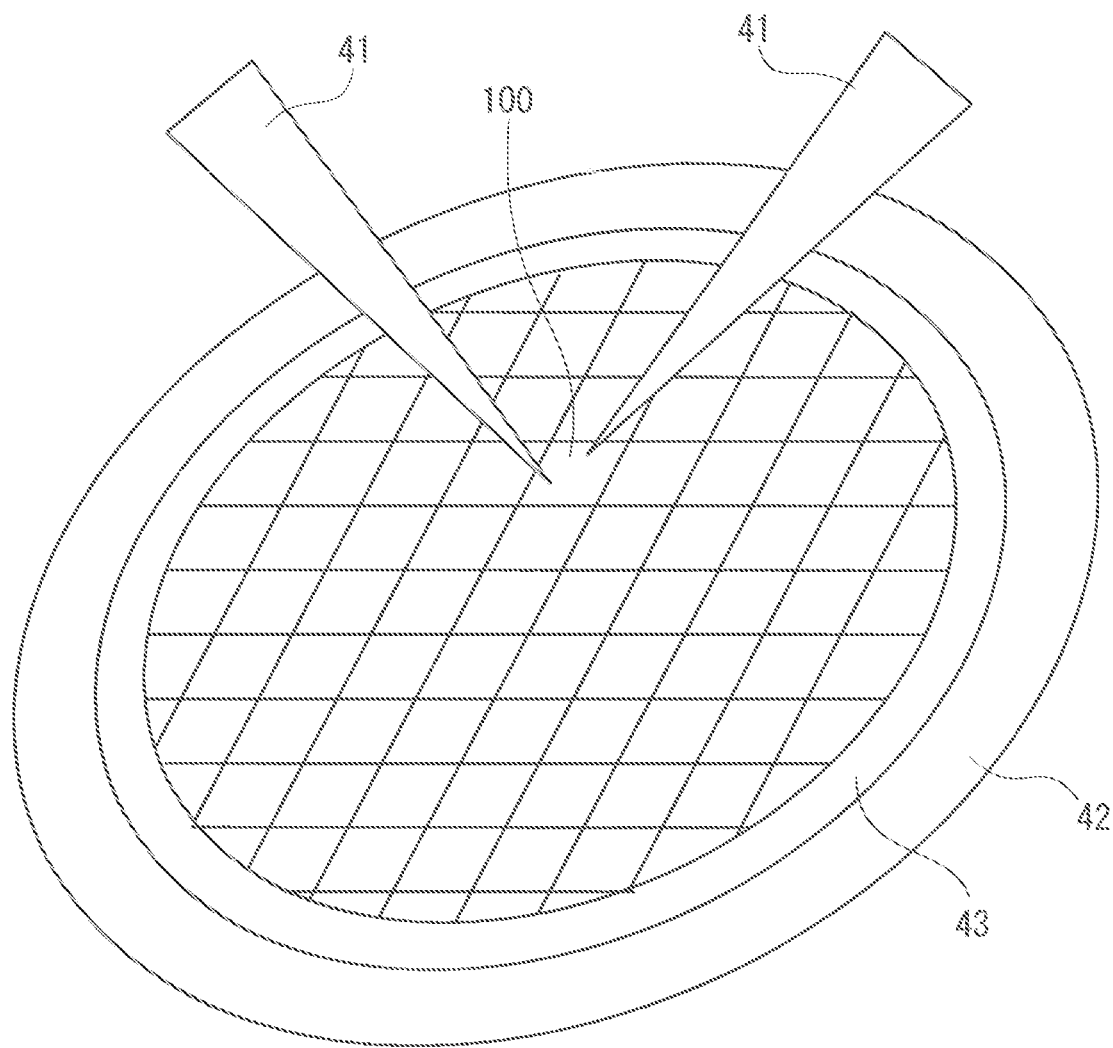
FIG. 2 illustrates an example method for monitoring a crack in the semiconductor device according to Embodiment 1.

A crack can be monitored, basically, when the semiconductor device 100 is a diced chip. As illustrated in FIG. 2, for example, even when a plurality of the semiconductor devices 100 obtained by dicing a wafer are disposed on a dicing tape 43 adhered to a dicing ring 42, a crack can be monitored by bringing a probe 41 in contact with the monitor electrode 34 and the other electrode in each of the semiconductor devices 100 to measure the leakage current or the potential difference. Here, the presence or absence of a crack caused by the dicing can be checked.

Figure 3:
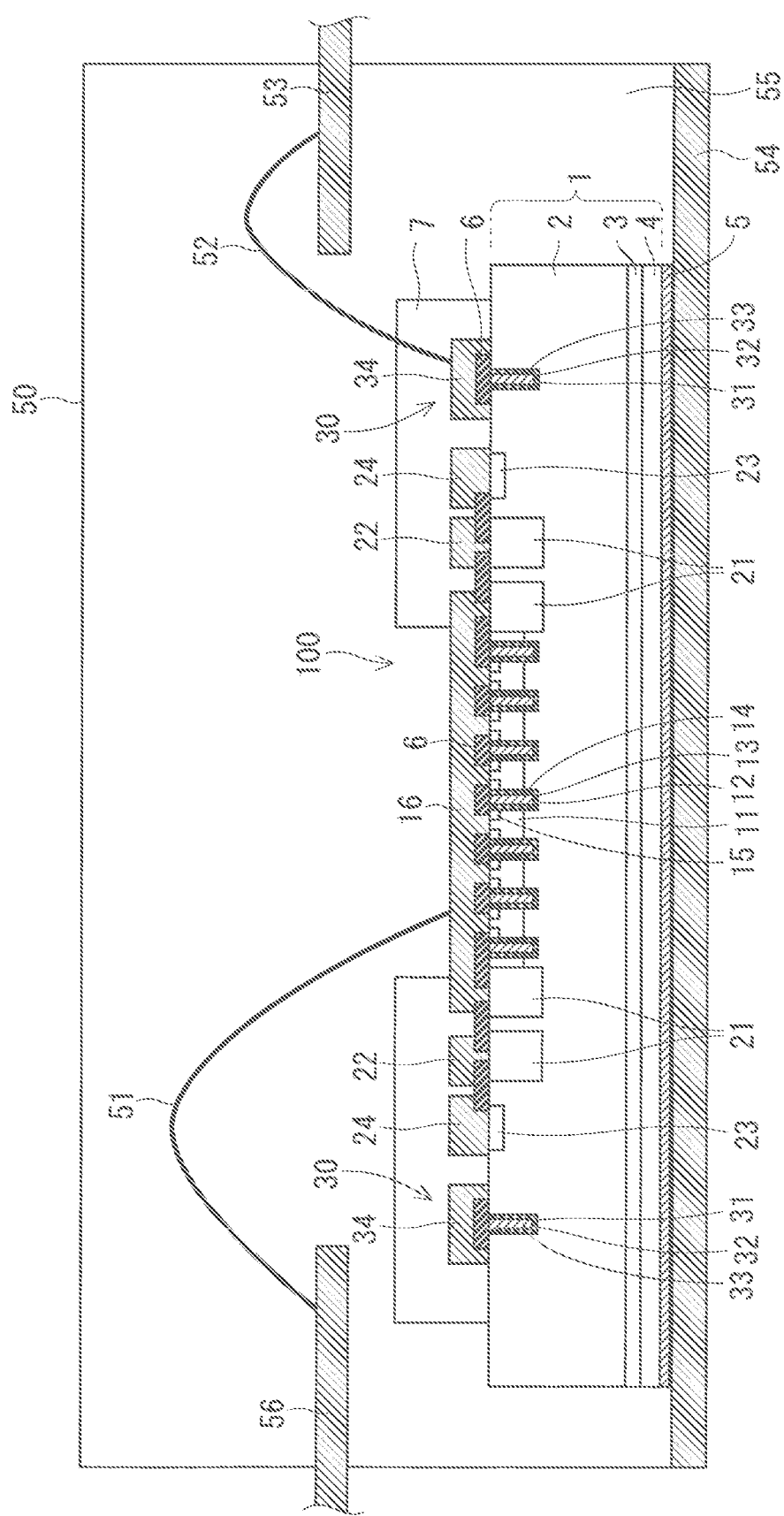
FIG. 3 illustrates an example method for monitoring a crack in the semiconductor device according to Embodiment 1.

As illustrated in FIG. 3, for example, even after the semiconductor device 100 is incorporated into a semiconductor module 50, a crack can be monitored. The semiconductor module 50 in FIG. 3 has a structure in which the constituent elements of the semiconductor module 50 are packaged using a mold resin 55. The semiconductor module 50 includes: the semiconductor device 100; a crack detection external electrode 53 connected to the monitor electrode 34 of the semiconductor device 100 through a wire 52 made of, for example, aluminum or gold; an emitter external electrode 56 connected to the emitter electrode 16 of the semiconductor device 100 through a wire 51; and a collector external electrode 54 connected to the collector electrode 5 of the semiconductor device 100.

A crack can be monitored by measuring the leakage current or the potential difference, for example, between the crack detection external electrode 53 and the collector external electrode 54 or between the crack detection external electrode 53 and the emitter external electrode 56. Here, the cracking progress in the semiconductor device 100 which is caused by the stress from the packaging in the semiconductor module 50 can be detected.

For example, when the semiconductor module 50 is periodically checked in actual use, the cracking progress caused by the thermal stress in actual use can also be detected by monitoring a crack in the semiconductor device 100 in the aforementioned method. Here, maintenance such as replacing the semiconductor module 50 can be performed before the semiconductor device 100 is broken due to a crack.

Although FIG. 3 illustrates the crack detection external electrode 53, the collector external electrode 54, and the emitter external electrode 56 as three external electrodes of the semiconductor module 50, the semiconductor module 50 may include an external electrode connected to, for example, the channel stopper electrode 24 or the LR electrode 22 of the semiconductor device 100. A crack in the semiconductor device 100 can be monitored by measuring the leakage current or the potential difference between the crack detection external electrode 53 and any one of the other external electrodes.

Embodiment 2

Figure 4:
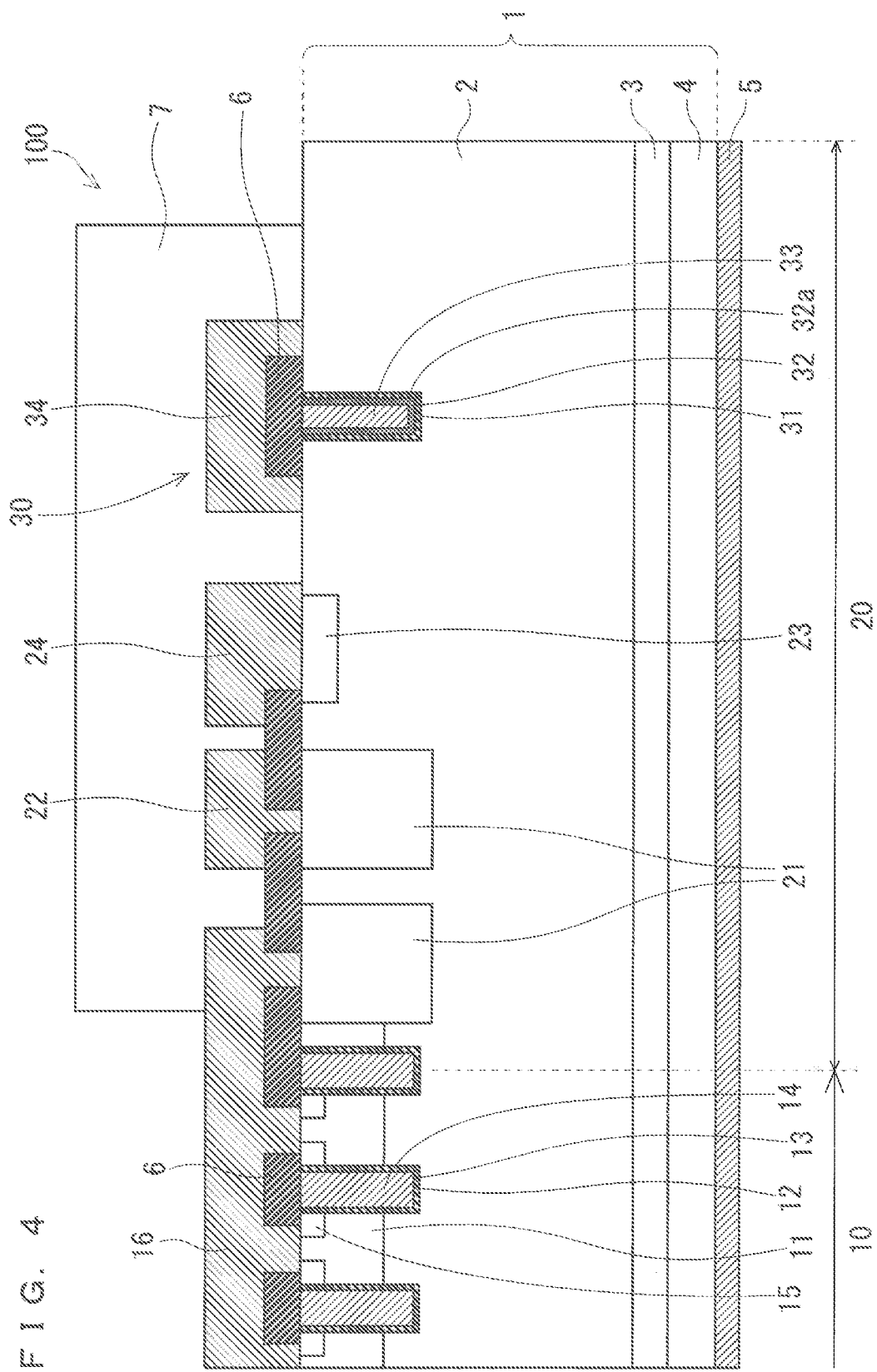
FIG. 4 is a cross section illustrating a structure of a semiconductor device according to Embodiment 2.

FIG. 4 is a cross section illustrating a structure of the semiconductor device 100 according to Embodiment 2. FIG. 4 illustrates an enlarged right half of the cross section of the semiconductor device 100. Since in FIG. 4, the same reference numerals are attached to the same elements as those in FIG. 1, the description is omitted.

In the semiconductor device 100 according to Embodiment 2, for example, an additional inner-wall insulating film 32a that is a silicon oxide film is stacked on the inner-wall insulating film 32 of the crack detection structure 30. Thus, the substantial thickness of the inner-wall insulating film 32 (a thickness including the additional inner-wall insulating film 32a) is greater than that of the gate insulating film 13. In the description according to Embodiment 1 hereinafter, the thickness of the inner-wall insulating film 32 means the thickness including the additional inner-wall insulating film 32a.

The additional inner-wall insulating film 32a can be formed by, for example, forming a thermally oxidized film on the inner wall of the trench 31 as the inner-wall insulating film 32 and then depositing an oxide film thereon. If the trench 31 is filled with the additional inner-wall insulating film 32a, the embedded electrode 33 cannot be formed in the trench 31. To prevent this, the dimension of the trench 31 needs to be more than double the thickness of the additional inner-wall insulating film 32a.

In the semiconductor device 100 according to Embodiment 2, thickening the inner-wall insulating film 32 can prevent a break in the inner-wall insulating film 32 due to a factor other than a crack, for example, application of a voltage between the collector electrode 5 and the emitter electrode 16 in actual operations.

Embodiment 3

Figure 5:
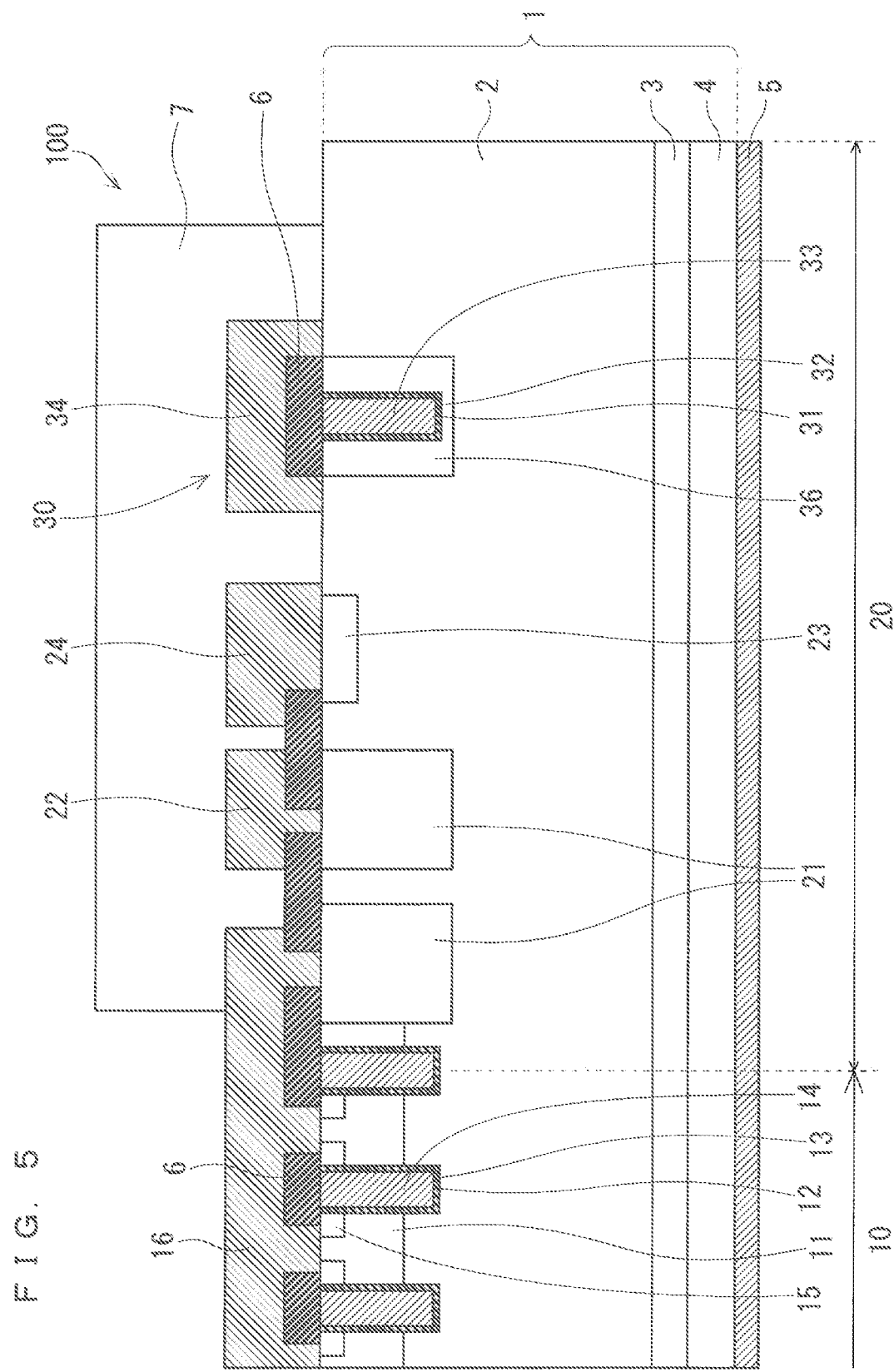
FIG. 5 is a cross section illustrating a structure of a semiconductor device according to Embodiment 3.

FIG. 5 is a cross section illustrating a structure of the semiconductor device 100 according to Embodiment 3. FIG. 5 also illustrates an enlarged right half of the cross section of the semiconductor device 100. Since in FIG. 5, the same reference numerals are attached to the same elements as those in FIG. 1, the description is omitted.

The trench 31 of the crack detection structure 30 is formed in the n-type drift layer 2 in the semiconductor device 100 according to Embodiment 3. Furthermore, a p-type region 36 of the second conductivity type surrounding the trench 31 is formed proximate to the trench 31. When a voltage is applied between the collector electrode 5 and the emitter electrode 16, forming a p-n junction between the n-type drift layer 2 and the p-type region 36 around the trench 31 can reduce a voltage to be applied to the inner-wall insulating film 32, and reduce an electric field intensity in the inner-wall insulating film 32. This can prevent a break in the inner-wall insulating film 32 with application of a voltage between the collector electrode 5 and the emitter electrode 16 in actual operations.

Figure 6:
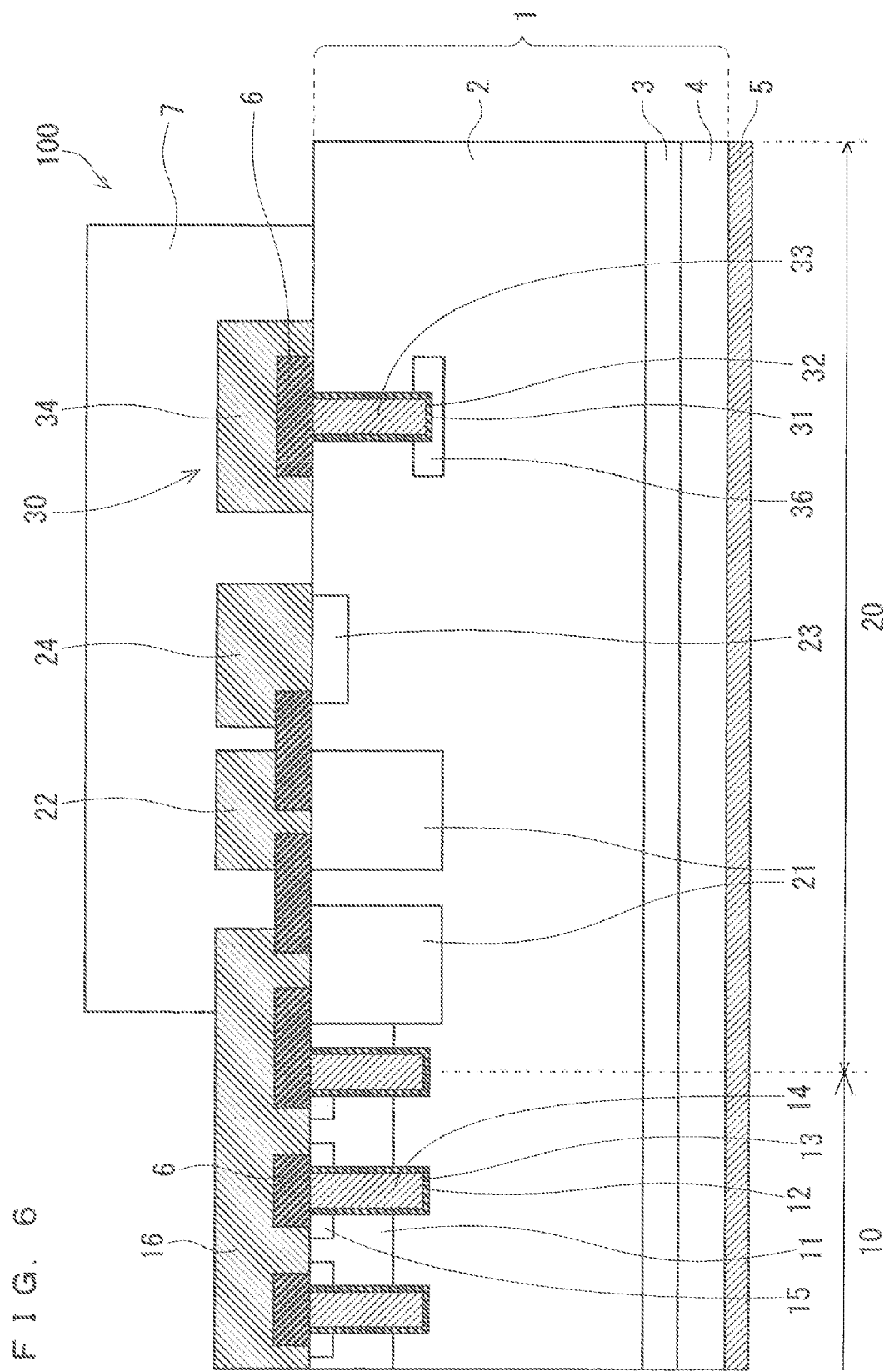
FIG. 6 is a cross section illustrating a structure of a semiconductor device according to Embodiment 3.

Since an electric field tends to be concentrated particularly on the vicinity of the bottom of the trench 31, forming the p-type region 36 at least around live bottom of the trench 31 can produce sufficient advantages. For example, as illustrated in FIG. 6, the p-type region 36 may be formed only around the bottom of the trench 31.

Embodiment 4

Figure 7:
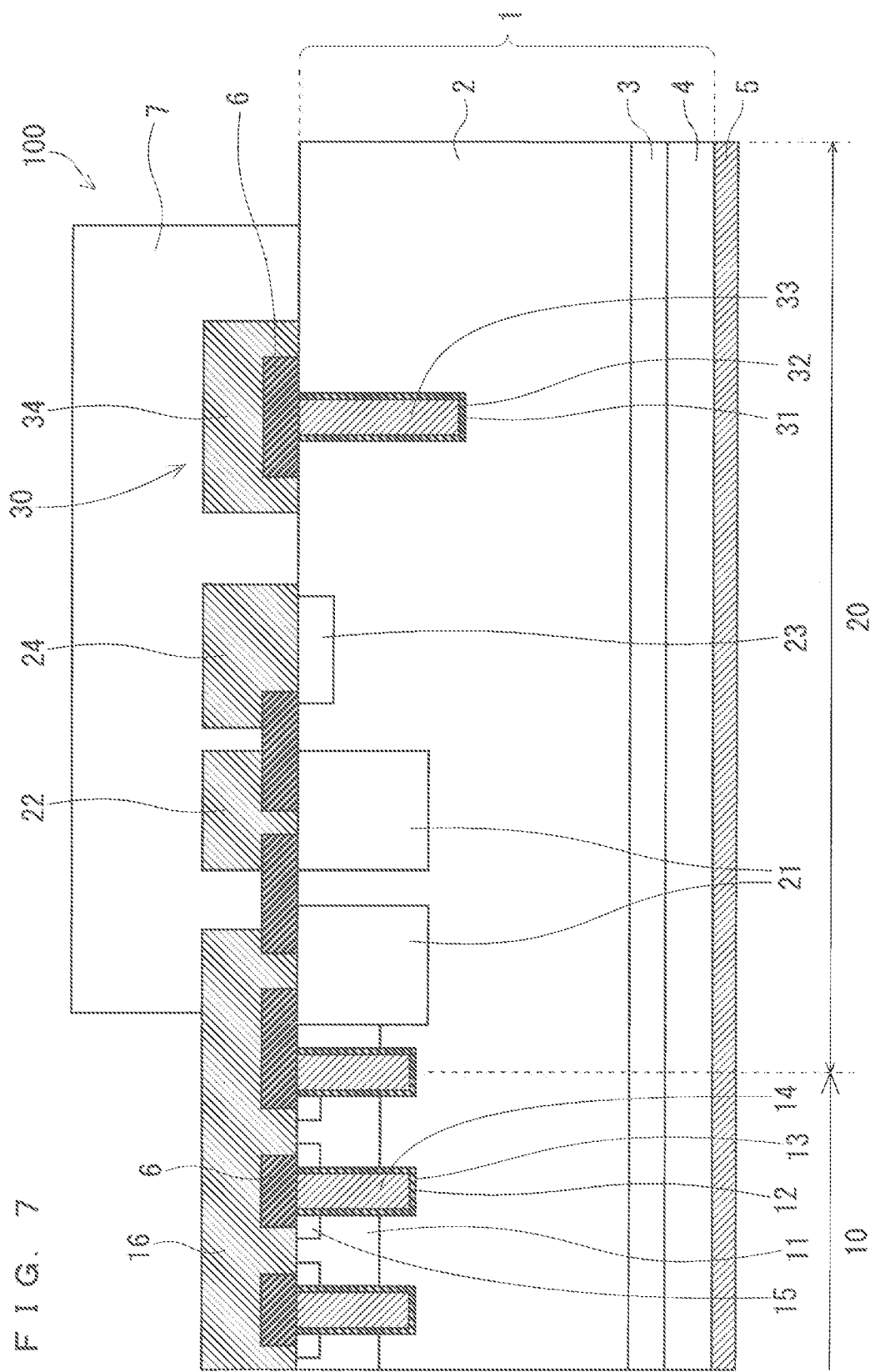
FIG. 7 is a cross section illustrating a structure of a semiconductor device according to Embodiment 4.

FIG. 7 is a cross section illustrating a structure of the semiconductor device 100 according to Embodiment 4. FIG. 7 also illustrates an enlarged rigid half of the cross section of the semiconductor device 100. Since in FIG. 7, the same reference numerals are attached to the same elements as those in FIG. 1, the description is omitted.

In the semiconductor device 100 according to Embodiment 4, the trench 31 of the crack detection structure 30 is deeper than the gate trenches 12. Deepening the trench 31 can improve the detection sensitivity of a crack.

Embodiment 5

Figure 8:
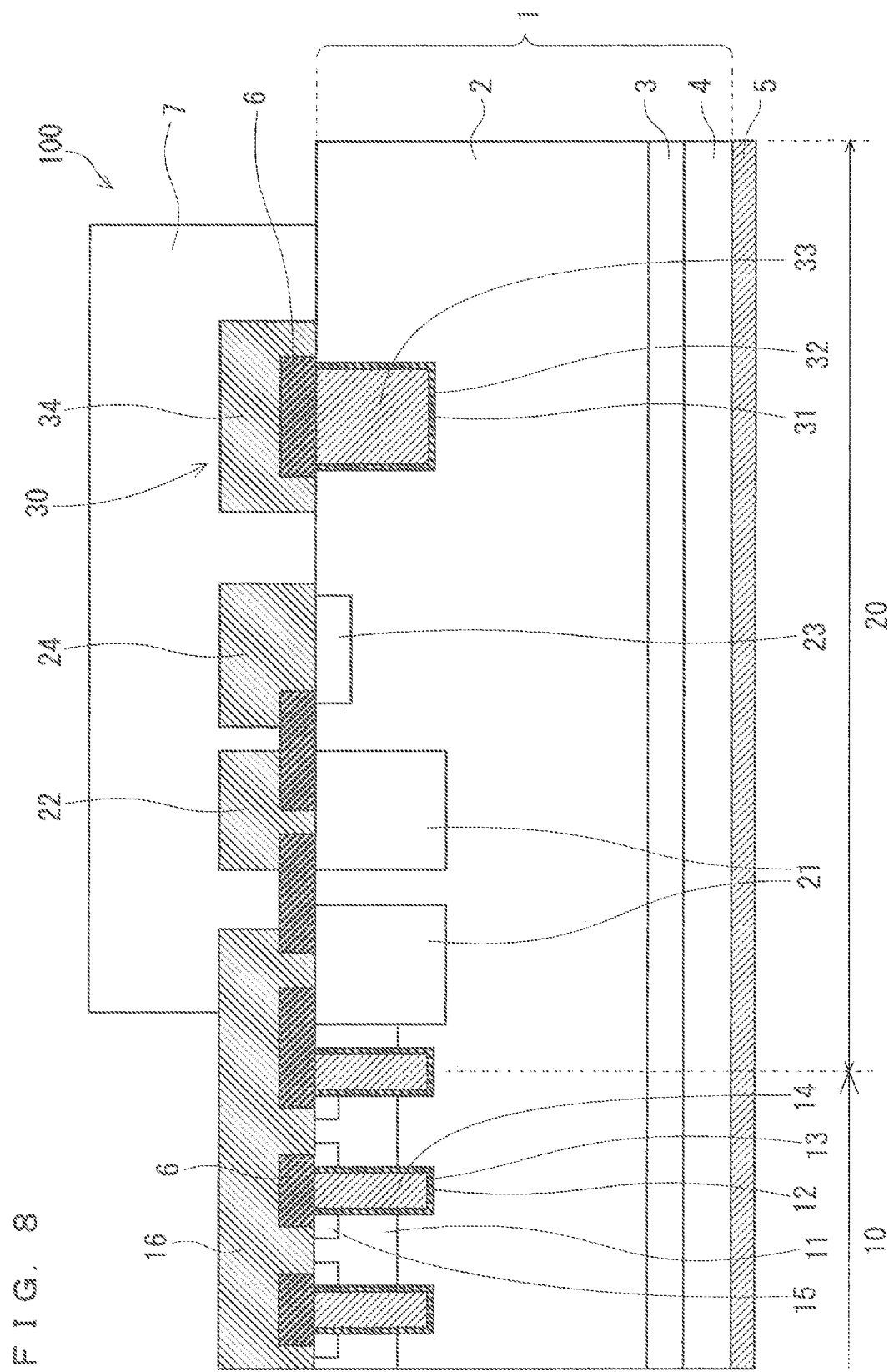
FIG. 8 is a cross section illustrating a structure of a semiconductor device according to Embodiment 5.

FIG. 8 is a cross section illustrating a structure of the semiconductor device 100 according to Embodiment 5. FIG. 8 also illustrates an enlarged right half of the cross section of the semiconductor device 100. Since in FIG. 8, the same reference numerals are attached to the same elements as those in FIG. 1, the description is omitted.

In the semiconductor device 100 according to Embodiment 5, the trench 31 of the crack detection structure 30 is wider than the gate trenches 12. Widening the trench 31 facilitates embedding of a material of the embedded electrode 33.

Embodiments can be freely combined, and each of Embodiments can be appropriately modified or omitted.

What is claimed is:

1. A semiconductor device, comprising:
a semiconductor layer including an active region in which a semiconductor element is formed, and an edge termination region outside the active region; and
a crack detection structure formed in the edge termination region,
wherein the crack detection structure includes:
a trench formed in the semiconductor layer and extending in a circumferential direction of the edge termination region;
an inner-wall insulating film formed on an inner wall of the trench;
an embedded electrode formed on the inner-wall insulating film and embedded into the trench; and
a monitor electrode formed on the semiconductor layer and connected to the embedded electrode.

2. The semiconductor device according to claim 1,
wherein the semiconductor element is an insulated-gate semiconductor element including a gate insulating film and a gate electrode, and
the inner-wall insulating film of the crack detection structure is thicker than the gate insulating film of the semiconductor element.

3. The semiconductor device according to claim 1,
wherein the trench of the crack detection structure is formed in a drift layer of a first conductivity type in the semiconductor layer, and
a region of a second conductivity type at least surrounding a bottom of the trench in the drift layer is formed around the trench.

4. The semiconductor device according to claim 1,
wherein the semiconductor element is a trench-gate semiconductor element including a gate insulating film and a gate electrode that are embedded in a trench formed in the semiconductor layer, and
the trench of the crack detection structure is deeper than the trench of the semiconductor element.

5. The semiconductor device according to claim 1,
wherein the semiconductor element is a trench-gate semiconductor element including a gate insulating film and a gate electrode that are embedded in a trench formed in the semiconductor layer, and
the trench of the crack detection structure is wider than the trench of the semiconductor element.

6. A method for detecting a crack in the semiconductor device according to claim 1, the method comprising:
measuring a leakage current or a potential difference between the monitor electrode of the crack detection structure and another electrode included in the semiconductor device; and
determining the presence or absence of a crack in the semiconductor device, based on a value of the leakage current or the potential difference that has been measured.

* * * * *